US008231730B2

(12) United States Patent
McLean (10) Patent No.: US 8,231,730 B2
(45) Date of Patent: Jul. 31, 2012

(54) COMBUSTION DEPOSITION BURNER AND/OR RELATED METHODS

(75) Inventor: David D. McLean, Hazel Park, MI (US)

(73) Assignee: Guardian Industries Corp., Auburn Hills, MI (US)

(*) Notice: Subject to any disclaimer, the term of this patent is extended or adjusted under 35 U.S.C. 154(b) by 812 days.

(21) Appl. No.: 12/155,762

(22) Filed: Jun. 9, 2008

(65) Prior Publication Data

US 2009/0304941 A1 Dec. 10, 2009

(51) Int. Cl.
*C23C 16/00* (2006.01)
*C23C 16/455* (2006.01)
*C23C 16/453* (2006.01)

(52) U.S. Cl. ...................................... 118/715
(58) Field of Classification Search .................. 118/715
See application file for complete search history.

(56) References Cited

U.S. PATENT DOCUMENTS

| | | | |
|---|---|---|---|
| 3,561,399 A * | 2/1971 | Federman ................ | 118/65 |
| 3,942,473 A * | 3/1976 | Chodash ................. | 118/610 |
| 5,652,021 A | 7/1997 | Hunt et al. | |
| 5,858,465 A | 1/1999 | Hunt et al. | |
| 6,013,318 A | 1/2000 | Hunt et al. | |
| 6,641,929 B2 * | 11/2003 | Kelly et al. ............... | 428/632 |
| 8,034,175 B2 * | 10/2011 | Utsunomiya et al. ..... | 118/715 |
| 8,137,469 B2 * | 3/2012 | Hawtof et al. ............ | 118/725 |
| 2002/0132374 A1 * | 9/2002 | Basceri et al. ............ | 438/3 |
| 2003/0077387 A1 * | 4/2003 | Brynolf et al. ............ | 427/223 |
| 2003/0235798 A1 * | 12/2003 | Moore et al. .............. | 431/353 |
| 2007/0134608 A1 * | 6/2007 | Tautz ....................... | 431/350 |
| 2008/0017694 A1 * | 1/2008 | Schnell et al. ............ | 228/119 |
| 2009/0233088 A1 * | 9/2009 | Lewis et al. ............... | 428/331 |
| 2009/0233105 A1 * | 9/2009 | Remington et al. ........ | 428/432 |
| 2009/0304941 A1 * | 12/2009 | McLean ..................... | 427/446 |
| 2010/0129561 A1 * | 5/2010 | McLean ..................... | 427/446 |
| 2010/0154474 A1 * | 6/2010 | Beall et al. ................. | 65/17.4 |
| 2011/0159198 A1 * | 6/2011 | McLean et al. ............ | 427/446 |
| 2011/0159199 A1 * | 6/2011 | McLean et al. ............ | 427/446 |

FOREIGN PATENT DOCUMENTS

DE 78 517 1/1894

(Continued)

OTHER PUBLICATIONS

International Search Report dated Sep. 3, 2009.

(Continued)

Primary Examiner — Jeffrie R Lund
(74) Attorney, Agent, or Firm — Nixon & Vanderhye P.C.

(57) ABSTRACT

Certain example embodiments relate to a burner for use in combustion deposition depositing a coating on a substrate. First and second spaced-apart combustion gas manifolds are configured to respectively produce first and second flames (which may effectively combine to form a single flame front beyond the outer face of the burner in certain example embodiments). The first and second combustion gas manifolds form a precursor reaction zone therebetween. An adjustable precursor delivery manifold located between the first and second combustion gas manifolds is configured to receive a precursor used in forming the coating. The precursor delivery manifold is positioned so as to substantially directly provide the precursor to a desired or predetermined portion of the precursor reaction zone. The precursor delivery manifold includes first and second cooled walls arranged to reduce the occurrence of precursor pre-reactions upstream of the precursor reaction zone. The burners of certain example embodiments may be used to combustion deposition deposit metal oxide coatings onto glass substrates.

19 Claims, 3 Drawing Sheets

FOREIGN PATENT DOCUMENTS

| | | |
|---|---|---|
| EP | 1 602 633 | 12/2005 |
| JP | 06 221525 | 8/1994 |

OTHER PUBLICATIONS

"Metal oxide powder synthesis by the emulsion combustion Method," Tani et al., J. Mater. Res., vol. 13, No. 5, May 1998, pp. 1099-1102.

"Morphology of Oxide Particles Made by the Emulsion Combustion Method," Tani et al., J. American Ceramic Society, 2003, vol. 86, No. 6, pp. 898-904.

"Dynamics of Hollow and Solid Alumina Particle Formation in Spray Flames," Tani et al., J. American Ceramic Society, 2004, vol. 87, No. 3, pp. 523-525.

"Criteria for Flame-Spray Synthesis of Hollow, Shell-Like, or Inhomogeneous Oxides," Jossen et al., J. American Ceramic Society, 2005, vol. 88, No. 6, pp. 1388-1393.

"Liquid-fed Aerosol Reactors for One-step Synthesis of Nano-structured Particles," Mädler, KONA No. 22, 2004, pp. 107-120.

"Flame aerosol synthesis of smart nanostructured materials," Strobel et al., J. Mater. Chem., 2007, 17, pp. 4743-4756.

\* cited by examiner

COMBUSTION DEPOSITION BURNER AND/OR RELATED METHODS

FIELD OF THE INVENTION

Certain example embodiments of this invention relate to the deposition of metal oxide coatings onto substrates via combustion deposition. More particularly, certain example embodiments relate to a burner design that enables a precursor to be delivered substantially directly within a desired portion of a precursor reaction zone, while also helping to reduce the occurrence of precursor pre-reactions along the precursor delivery path (e.g., upstream of the precursor reaction zone). In certain example embodiments, the reaction location and/or reaction window may be changed so as to affect chemical reactions, adjust coating properties, enhance uniformity, control dynamic deposition rate, etc.

BACKGROUND AND SUMMARY OF EXAMPLE EMBODIMENTS OF THE INVENTION

Reagent concentration, temperature, and residence time are known factors that drive chemical reactions. Combustion chemical vapor deposition (combustion CVD) processes are no different. The significance of these factors and their controlling process parameters has been well documented.

Combustion chemical vapor deposition (combustion CVD) is a relatively new technique for the growth of coatings. Combustion CVD is described, for example, in U.S. Pat. Nos. 5,652,021; 5,858,465; and 6,013,318, each of which is hereby incorporated herein by reference in its entirety.

Conventionally, in combustion CVD, precursors are dissolved in a flammable solvent and the solution is delivered to the burner where it is ignited to give a flame. Such precursors may be vapor or liquid and fed to a self-sustaining flame or used as the fuel source. A substrate is then passed under the flame to deposit a coating.

There are several advantages of combustion CVD over traditional pyrolytic deposition techniques (such as CVD, spray and sol-gel, etc.). One advantage is that the energy required for the deposition is provided by the flame. A benefit of this feature is that the substrate typically does not need to be heated to temperatures required to activate the conversion of the precursor to the deposited material (e.g., a metal oxide). Also, a curing step (typically required for spray and sol-gel techniques) typically is not required. Another advantage is that combustion CVD techniques do not necessarily require volatile precursors. If a solution of the precursor can be atomized/nebulized sufficiently (e.g., to produce droplets and/or particles of sufficiently small size), the atomized solution will behave essentially as a gas and can be transferred to the flame without requiring an appreciable vapor pressure from the precursor of interest.

Conventional combustion CVD processes involve passing a precursor material directly through the entire length of the flame. In some conventional techniques, a precursor/solvent solution is used as the fuel source. The temperature and residence time profile experienced by the precursor is controlled by the combustion conditions and/or burner-to-substrate distance. Unfortunately, however, these control mechanisms can be fairly limited, depending on the particular application.

The inventor of the instant application has realized that independent control over precursor delivery within a self-sustaining flame would provide greater reaction control capability and, to this end, has developed the burner design of certain example embodiments that enhances control. Additionally, confining the precursor reaction zone within a relatively small portion of the combustion reaction zone should provide a more consistent product, e.g., by substantially narrowing the distribution of the time/temperature profile experienced by the precursor.

Figure 1:
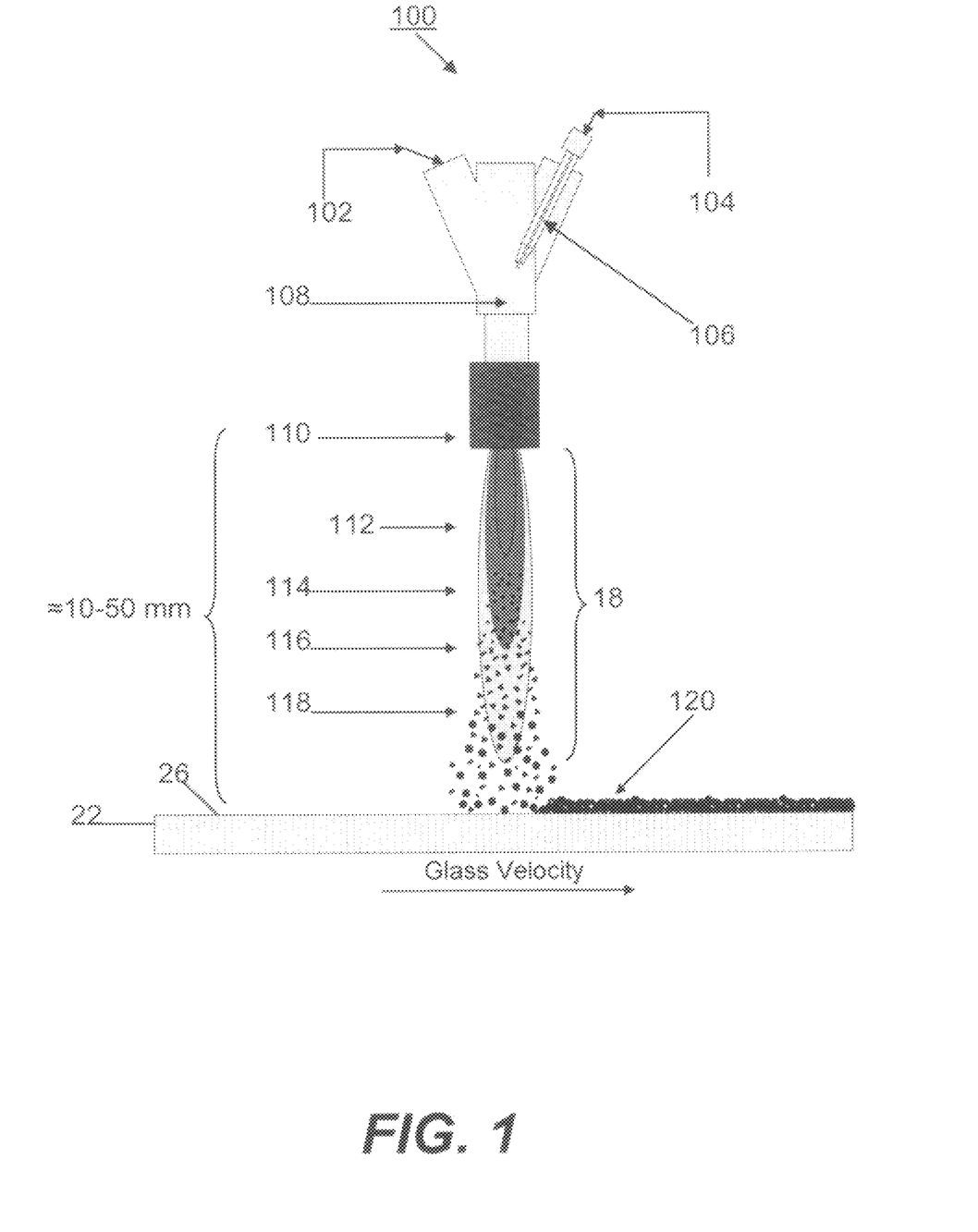
FIG. 1 is a simplified view of an apparatus including a linear burner used to carry out combustion deposition.

The vast majority of combustion deposition work performed to-date by the assignee of the instant application has used a linear burner developed by Webber and provided by SURA Instruments. FIG. 1 is a simplified view of an apparatus 100 including a linear burner used to carry out combustion deposition. A combustion gas 102 (e.g., a propane air combustion gas) is fed into the apparatus 100, as is a suitable precursor 104 (e.g., via insertion mechanism 106, examples of which are discussed in greater detail below). Precursor nebulization (108) and at least partial precursor evaporation (110) occur within the apparatus 100 and also may occur external to the apparatus 100, as well. The precursor could also have been delivered as a vapor reducing or even eliminating the need for nebulization The flame 18 may be thought of as including multiple areas. Such areas correspond to chemical reaction area 112 (e.g., where reduction, oxidation, and/or the like may occur), nucleation area 114, coagulation area 116, and agglomeration area 118. Of course, it will be appreciated that such example areas are not discrete and that one or more of the above processes may begin, continue, and/or end throughout one or more of the other areas.

Particulate matter begins forming within the flame 18 and moves downward towards the surface 26 of the substrate 22 to be coated, resulting in film growth 120. As will be appreciated from FIG. 1, the combusted material comprises non-vaporized material (e.g., particulate matter), which is also at least partially in particulate form when coming into contact with the substrate 22. To deposit the coating, the substrate 22 may be moved (e.g., in the direction of the velocity vector). Of course, it will be appreciated that the present invention is not limited to any particular velocity vector, and that other example embodiments may involve the use of multiple apparatuses 100 for coating different portions of the substrate 22, may involve moving a single apparatus 100 while keeping the substrate in a fixed position, etc. The burner 110 is about 5-50 mm from the surface 26 of the substrate 22 to be coated.

The linear burner shown in FIG. 1 may be fueled by a premixed combustion gas comprising propane and air. It is, of course, possible to use other combustion gases such as, for example, natural gas, butane, etc. The standard operating window for the linear burner involves air flow rates of between about 150 and 300 standard liters per minute (SLM), using air-to-propane ratios of about 15 to 25. Successful coatings require controlling the burner-to-lite distance to between about 5-50 mm when this particular burner is used.

As one example of how this particular burner was used, it is noted the inventor of the instant application attempted to deposit a single layer anti-reflective (SLAR) film of silicon oxide (e.g., $SiO_2$ or other suitable stoichiometry) on a glass substrate to alter the optical and other properties of the glass substrates (e.g., to increase visible transmission). The attempt achieved an increase in light transmission in the visible spectrum (e.g., wavelengths of from about 400-700 nm) over clear float glass with an application of the film on one or both sides of a glass substrate. In addition, increases in light transmission for wavelengths greater the 700 nm are also achievable and also may be desirable for certain product applications, such as, for example, photovoltaic solar cells. The clear float glass used in connection with the description herein is a low-iron glass known as "Extra Clear," which has a visible transmission typically in the range of 90.3% to about 91.0%. Of course, the examples described herein are not limited to this particular type of glass, or any glass with this particular visible transmission. More particularly, using the above techniques, the inventor of the instant application was able to produce coatings that provided a transmission gain of 1.96% or 1.96 percentage points over the visible spectrum when coated on a single side of clear float glass. The transmission gain may be attributable in part to some combination of surface roughness increases and air incorporation in the film that yields a lower effective index of refraction. Typical process conditions for successful films used a burner air flow of about 225 SLM, an air-to-propane ratio of about 19, a burner-to-lite distance of 35 mm, and a glass substrate velocity of about 50 mm/sec.

Recently, efforts have focused on investigating alternative burner designs. These efforts have led to the exploration of infrared and non-linear (e.g., two dimensional) burners produced by Maxon Corporation. One example of an IR burner design is disclosed in co-pending and commonly assigned application Ser. No. 12/000,784, filed on Dec. 17, 2007, the entire contents of which is hereby incorporated herein by reference.

Some techniques use a combustion deposition device in which the precursor is delivered independent of the flame. This approach is described in, for example, U.S. Publication No. 2005/0061036, the entire contents of which is hereby incorporated herein by reference. However, these products appear to involve substantially different burner designs and also appear to be limited to the deposition of optical preforms. Current remote CCVD (R-CCVD) efforts, such as those performed by Innovent, for example, aim for greater control over reaction conditions by delivering the precursor externally to the flame. The assignee of the instant invention currently is working with Innovent (Jena, Germany) to develop a remote combustion CVD technology for the deposition of titanium oxide coatings. In one example of such a process, the precursor is delivered to the substrate between two burners. The proposed design of certain example embodiments (described in greater detail below) differs from R-CCVD efforts in that the precursor may be passed directly through a predetermined portion of the flame where combustion is taking place, although this is not a requirement of the design. In certain example embodiments that also differ from R-CCVD efforts, the precursor may be sent substantially directly into a given location of the reaction (combustion) zone from within the flame. Additionally, the part of the flame through which the precursor passes can be adjusted, which provides different temperature and residence time profiles and different concentrations and types of various reactive species in the flame. The precursor may be substantially entirely enclosed in the combustion reaction zone in certain example embodiments.

In view of the above, although certain conventional and/or current techniques provide some control over the above-noted and/or other factors, further improvements are still possible and desired. Indeed, the inventor of the instant application is not aware of any commercially available burners that have been developed specifically for combustion deposition techniques. Thus, it will be appreciated that there is a need in the art for a burner system that provides enhanced control over reagent concentration, temperature, residence time, and/or other factors. It also will be appreciated that there is a need in the art for a versatile burner capable of accommodating large area combustion deposition coating applications.

In certain example embodiments of this invention, a burner for use in combustion deposition depositing a coating on a substrate is provided. First and second spaced-apart combustion gas manifolds are configured to respectively produce first and second flames (which may effectively combine to form a single flame front beyond the outer face of the burner in certain example embodiments). The first and second combustion gas manifolds form a precursor reaction zone therebetween. An adjustable precursor delivery manifold located between the first and second combustion gas manifolds is configured to receive a precursor used in forming the coating. The precursor delivery manifold is positioned so as to substantially directly provide the precursor to a desired or predetermined portion of the precursor reaction zone, which may be within the flame. The precursor delivery manifold includes first and second cooled walls arranged to reduce the occurrence of precursor pre-reactions upstream of the precursor reaction zone.

In certain example embodiments, a combustion deposition burner is provided. First and second spaced-apart combustion gas manifolds are configured to respectively produce first and second flames (which may effectively combine to form a single flame front beyond the outer face of the burner in certain example embodiments). The first and second combustion gas manifolds form a precursor reaction zone therebetween. A vertically adjustable precursor delivery manifold located between the first and second combustion gas manifolds is configured to receive a precursor. The precursor delivery manifold is positioned so as to substantially directly provide the precursor to a desired or predetermined portion of the precursor reaction zone, and is at least partially defined by first and second cooled walls arranged to reduce the occurrence of precursor pre-reactions upstream of the precursor reaction zone. At least one capillary system is provided to receive a cooling heat transfer oil or other suitable heat transfer fluid. First and second ceramic refractories surround the first and second cooled walls. Each said combustion gas manifold includes a plurality of bleed holes and at least one baffle arranged to provide a substantially uniform gas flow across a face thereof. The precursor delivery manifold is configured to provide to the combustion reaction zone a substantially uniform distribution of a carrier that includes the precursor.

In certain example embodiments, a method of forming a coating on a glass substrate is provided. A burner having first and second spaced-apart combustion gas manifolds is configured to respectively produce first and second flames (which may effectively combine to form a single flame front beyond the outer face of the burner in certain example embodiments). A precursor reaction zone is formed between the first and second flames. A precursor used in forming the coating is provided substantially directly to a desired or predetermined portion of the precursor reaction zone via a vertically adjustable precursor delivery manifold located between the first and second combustion gas manifolds. The precursor delivery manifold includes first and second cooled walls arranged to reduce the occurrence of precursor pre-reactions upstream of the precursor reaction zone.

In certain example embodiments, a method of making a coated article comprising a coating supported by a substrate is provided. A burner having first and second spaced-apart combustion gas manifolds is configured to respectively produce first and second flames. A precursor reaction zone is formed between the first and second flames. A precursor used in forming the coating is provided substantially directly to a desired or predetermined portion of the precursor reaction zone via a vertically adjustable precursor delivery manifold located between the first and second combustion gas manifolds. The precursor delivery manifold includes first and second cooled walls arranged to reduce the occurrence of precursor pre-reactions upstream of the precursor reaction zone.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments relate to an improved burner for combustion deposition depositing coatings that enables enhanced control of reaction conditions and thus coating properties. In certain example instances, the burners of certain example embodiments may be used to combustion deposition deposit metal oxide films (e.g., silicon oxide, titanium oxide, and/or other metal oxides) on substrates. Advantageously, the burner design of certain example embodiments allows precursor material to be delivered to a specific location within the flame. In certain example embodiments, a precursor may be delivered substantially directly within the precursor reaction zone, and the burner design of certain example embodiments may help to reduce the occurrence of precursor pre-reactions along the delivery path (e.g., upstream of the precursor reaction zone). Furthermore, in certain example embodiments, the reaction location and/or reaction window may be changed so as to affect chemical reactions, adjust coating properties, enhance uniformity, control dynamic deposition rate, etc.

In certain example embodiments of this invention, a burner for use in combustion deposition depositing a coating on a substrate is provided. First and second spaced-apart combustion gas manifolds are configured to respectively produce first and second flames (which may effectively combine to form a single flame front beyond the outer face of the burner in certain example embodiments). The first and second combustion gas manifolds form a precursor reaction zone therebetween. An adjustable precursor delivery manifold located between the first and second combustion gas manifolds is configured to receive a precursor used in forming the coating. The precursor delivery manifold is positioned so as to substantially directly provide the precursor to a desired or predetermined portion of the precursor reaction zone. The precursor delivery manifold includes first and second cooled walls arranged to reduce the occurrence of precursor pre-reactions upstream of the precursor reaction zone.

In certain example embodiments, a combustion deposition burner is provided. First and second spaced-apart combustion gas manifolds are configured to respectively produce first and second flames (which may effectively combine to form a single flame front beyond the outer face of the burner in certain example embodiments). The first and second combustion gas manifolds form a precursor reaction zone therebetween. An adjustable (e.g., vertically adjustable, assuming the burner is oriented vertically) precursor delivery manifold located between the first and second combustion gas manifolds is configured to receive a precursor. The precursor delivery manifold is positioned so as to substantially directly provide the precursor to a desired or predetermined portion of the precursor reaction zone, and is at least partially defined by first and second cooled walls arranged to reduce the occurrence of precursor pre-reactions upstream of the precursor reaction zone. At least one capillary system is provided to receive a cooling heat transfer oil or other suitable heat transfer fluid. First and second ceramic refractories surround the first and second cooled walls (which may help provide additional shielding from the heat of the flame in certain example embodiments). Each said combustion gas manifold includes a plurality of bleed holes and at least one baffle arranged to provide a substantially uniform gas flow across a face thereof. The precursor delivery manifold is configured to provide to the combustion reaction zone a substantially uniform distribution of a carrier that includes the precursor.

In certain example embodiments, a method of forming a coating on a glass substrate is provided, and/or a method of making a coated article comprising a coating supported by a substrate is provided. A burner having first and second spaced-apart combustion gas manifolds is configured to respectively produce first and second flames (which may effectively combine to form a single flame front beyond the outer face of the burner in certain example embodiments). A precursor reaction zone is formed between the first and second flames. A precursor used in forming the coating is provided substantially directly to a desired or predetermined portion of the precursor reaction zone via a vertically adjustable precursor delivery manifold located between the first and second combustion gas manifolds. The precursor delivery manifold includes first and second cooled walls arranged to reduce the occurrence of precursor pre-reactions upstream of the precursor reaction zone.

Figure 2:
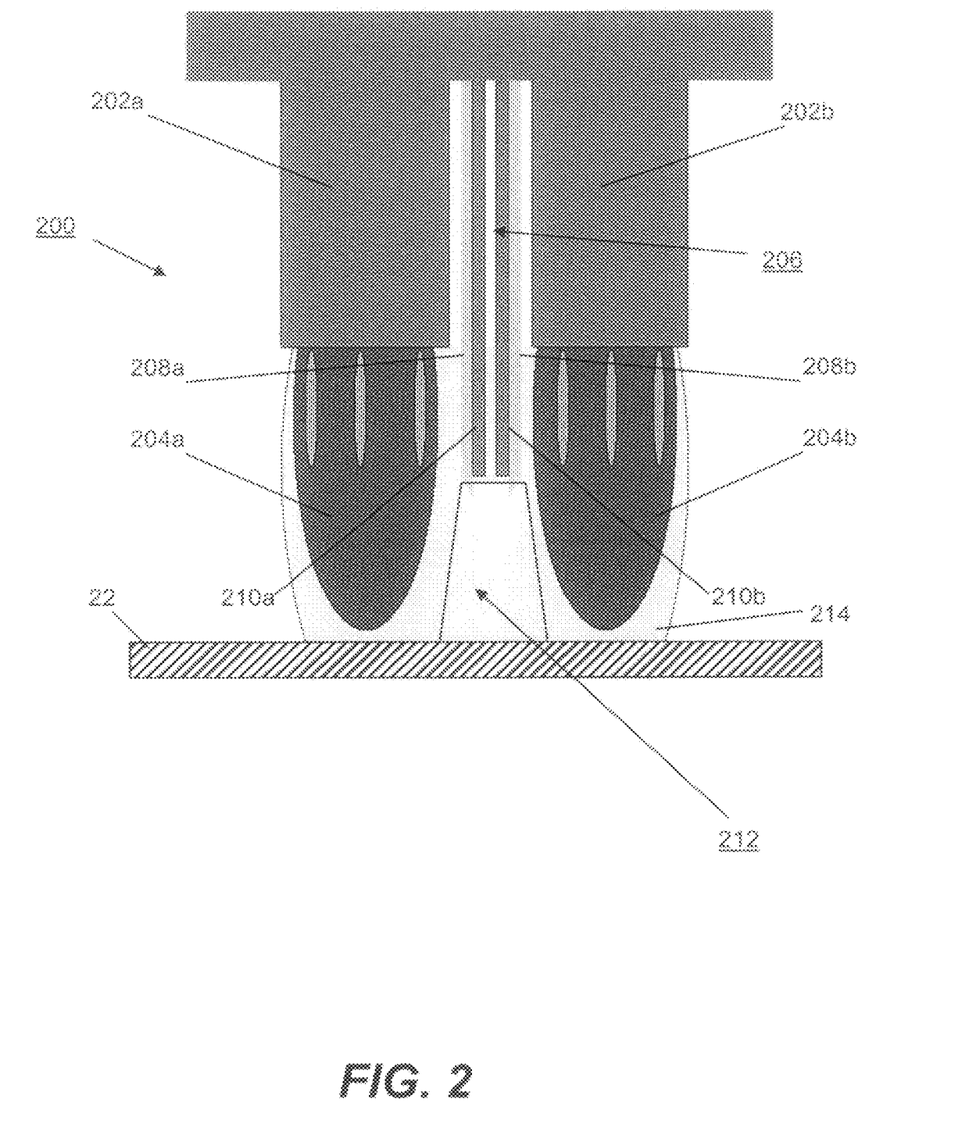
FIG. 2 is a simplified view of an improved combustion deposition apparatus in accordance with an example embodiment.

Referring now more particularly to the drawings in which like reference numerals indicate like components throughout the several views, FIG. 2 is a simplified view of an improved combustion deposition apparatus 200 in accordance with an example embodiment. The burner 200 shown in FIG. 2 includes first and second spaced-apart combustion gas manifolds 202a and 202b. The combustion gas manifolds 202a and 202b respectively produce first and second substantially linear and/or planar flames 204a and 204b which, in turn, form a precursor reaction zone 212 therebetween and proximate to the substrate 22. The first and second substantially linear and/or planar flames 204a and 204b may effectively combine to form a single flame front 214 beyond the outer face of the burner in certain example embodiments.

As noted above, the burner design of certain example embodiments allows precursor material to be delivered to a specific location within the flame. Accordingly, the precursor may be delivered through a separate precursor delivery manifold 206 located between the substantially linear and/or planar burner that substantially confines or defines the precursor reaction zone 212. The precursor delivery manifold 206 may be adjustable (e.g., vertically adjustable) to enable the more precise control of the precursor reaction zone 212 with respect to the burner face and substrate 22. In certain example embodiments, vertical positioning may be enabled by having the burner body being formed from one solid piece with the precursor delivery manifold being adjustably mounted within the burner body. Any suitable substantially vertical adjustment mechanism may be used in connection with certain example embodiments. For example, a rack and gear type adjustment mechanism may be provided in certain example embodiments. The rack and gear may be located towards the top of the assembly, e.g., away from the flames 204a and 204b and precursor reaction zone 212, whereas one or more slots, grooves, and/or channels may be located closer to the flames 204a and 204b and precursor reaction zone 212, e.g., for accepting protrusions provided to the precursor delivery manifold 206. Such an example arrangement advantageously may reduce the number of mechanical parts, especially near the areas exposed to high temperatures.

The precursor delivery manifold 206 may be constructed from any suitable high temperature superalloy (such as, for example, a tungsten alloy) having suitable mechanical properties including, for example, a low coefficient of thermal expansion.

One challenge in designing an improved burner relates to sufficiently cooling the interior precursor distribution manifold 206 so as to reduce the occurrence and/or extent of reactions occurring within the precursor delivery manifold 206 (e.g., upstream of the precursor reaction zone 212). It will be appreciated that the burner design of certain example embodiments involves targeting reactions and/or controlling conditions within the precursor reaction zone 212. Thus, reactions occurring within the precursor delivery manifold 206 may adversely affect the reactions occurring in the precursor reaction zone 212.

Heat transfer may be accomplished in certain example embodiments while a narrow profile of the precursor delivery manifold is maintained, e.g., proximate to the end or output nozzle thereof. Suitable heat transfer may be accomplished in certain example embodiments via the use of a heat transfer oil. More particularly, a heat transfer oil or other suitable material may be passed through small capillaries within the precursor delivery manifold 206, thereby providing cooling and helping to reduce the occurrence of the precursor reaching its decomposition temperature while inside of the precursor delivery manifold 206, itself. Example heat transfer oils include DOWTHERM and SYLTHERM (both commercially available from Dow Chemical), XCELTHERM 600 (commercially available from Radco), Duratherm S (commercially available from Duratherm), Therminol VP-1 (commercially available from Thermanol), and Dynalene 600 (commercially available from Dynalene Inc.). One or more capillaries for accommodating such oils may be formed in first and second cooling walls 210a and 210b that help define the precursor delivery manifold 206. Additionally, or in the alternative, the capillary system of certain example embodiments may include a re-circulating cooling system in the burner body and/or in the combustion gas manifolds.

A thin layer of ceramic refractory may surround the outer edges of the precursor delivery manifold 206 and may be used to help shield it from the heat of the flame(s) 204a and 204b. For example, as shown in FIG. 2, first and second thin pieces of ceramic refractory 208a and 208b sandwich the outer cooling walls 210a and 210b of the precursor delivery manifold 206. As shown in FIG. 2, the ends of the ceramic refractory pieces 208a and 208b extend slightly beyond the end of the precursory delivery manifold 206 (and thus into the precursor reaction zone 212).

In certain example embodiments, the entire burner body optionally may be cooled through the use of heat transfer oil. Other cooling mechanisms may be used in connection with, or in place of, the heat transfer oils. For example, cooling fins, vents, etc., may be used in connection with certain example embodiments. Moreover, such cooling mechanisms may be used to cool the interior section, burners, and/or the entire assembly, inasmuch as cooling the components alone, in various combinations, and/or as a whole may help to cool the areas of interest.

The precursor delivery manifold 206 itself may be very narrow in certain example embodiments. For example, the precursor delivery manifold 206 may have a width or diameter of about 2 mm in certain example embodiments for the open section that the precursor would flow through, whereas the walls may have a greater width or thickness (for example, about 5 mm). Furthermore, in certain example embodiments, most of the thickness may be attributed to the cooling sidewalls 210a and 210b. This arrangement advantageously may help control the temperature of the precursor and/or carrier coming through the precursor delivery manifold 206.

Figure 3A:
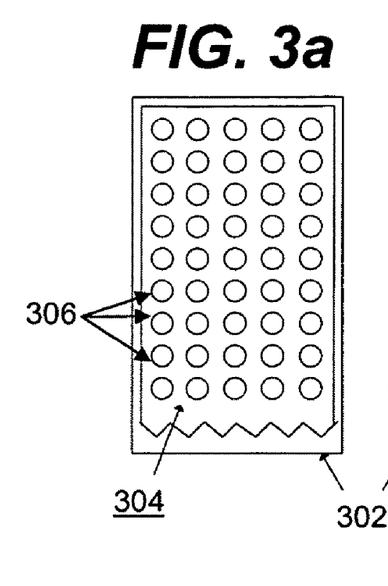
FIG. 3a is a top-down view of a manifold section including bleed holes, in accordance with an example embodiment.
Figure 3B:
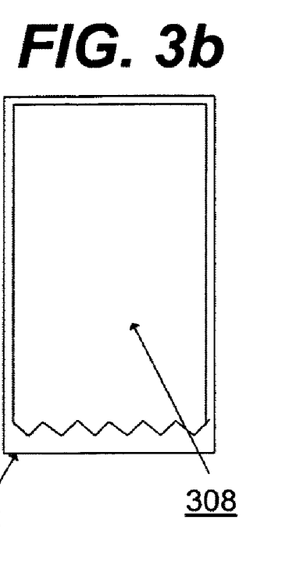
FIG. 3b is a top-down view of a manifold section including a baffle, in accordance with an example embodiment.
Figure 3C:
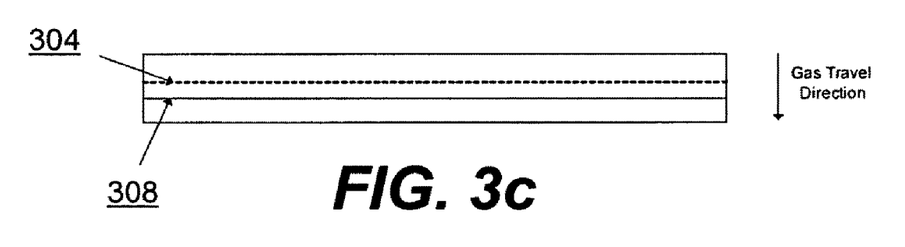
FIG. 3c is a side view of a manifold section including the bleed holes of FIG. 3a and the baffle of FIG. 3c, in accordance with an example embodiment.

The combustion manifolds may comprise a series of outlet holes separated from the inlet by one or more baffles and/or bleed holes, thereby helping to achieve a substantially uniform distribution of gas across the outer face. The outer face of the combustion manifolds may be linear or substantially planar in certain example embodiments. This arrangement is shown in greater detail in FIGS. 3a-3c. More particularly, FIG. 3a is a top-down view of a manifold section 304 including bleed holes 306, in accordance with an example embodiment, and FIG. 3b is a top-down view of a manifold section including a baffle 308, in accordance with an example embodiment. The bleed holes 306 and the baffle 308 are enclosed within walls 302 of the precursor manifold. It will be appreciated that the number, size, shape, and/or placement of the bleed holes 306 may vary in certain example embodiments. Moreover, the width(s) or diameter(s) of the bleed holes may vary from hole-to-hole in certain example embodiments. FIG. 3c is a side view of a manifold section including the bleed holes 306 of FIG. 3a and the baffle 308 of FIG. 3c, in accordance with an example embodiment. As can be seen from FIG. 3c, gas travels down the precursor manifold to the section 304 including the bleed holes 306, reaches the baffle 308, passes therethrough, and exits out of the manifold across its face. As noted above, this arrangement advantageously helps to create a substantially uniform distribution of gas across the outer face of the burner.

A similar configuration to the configuration of the combustion gas manifold described above may be used in connection with the precursor delivery manifold. For example, a similar configuration may be used to achieve a substantially even or uniform distribution of a precursor-inclusive carrier stream prior to entering the narrow shaft towards the outlet in the flame. Thus, in certain example embodiments, a similar bleed hole and/or baffle arrangement may be used in connection with the precursor delivery manifold. It will be appreciated that the opposite direction of travel also may be used to achieve a substantially even or uniform distribution.

Combustion gas for the support flame may be provided through a wire mesh, providing a substantially uniform flow along the edge of the row of outlet holes. Combustion gas feeds may be premixed fuel or fed by separate oxygen and fuel sources. In the latter case, the gasses may need to be kept separate until they leave the front of the burner face, and this may prompt further design considerations (e.g., the use of separate manifolds for the separate gases that are arranged such that the gasses are combined beyond the burner face). Similar to the combustion manifolds, a substantially uniform flow in the precursor delivery manifold may be obtained through a series of baffles and/or bleed holes. Optionally, in certain example embodiments, baffles can be constructed at or near manifold boundaries to achieve desirable flow patterns.

The burner system of certain example embodiments may be capable of supporting the process conditions noted above with respect to the conventional burner system shown in FIG. 1. Additionally, in certain example embodiments, a substrate (e.g., a glass substrate) may be at least initially heated to a temperature of about 60° C. to about 100° C., and a flame may be provided at a temperature of about 1200-1600K. For safety and/or other reasons, the entire burner assembly may be operated at a temperature of less than about 300° C. These temperatures may be adjusted in certain example embodiments, of course, based on the combustion conditions and materials used.

The precursor may be delivered to the precursor delivery manifold in by any suitable technique. For example, a precursor may be introduced in a vapor state via a bubbler or other means of vaporization or sublimation, as large particle droplets via an injector, and/or as small particle droplets via a nebulizer. It will be appreciated that a carrier may be required in certain example embodiments. For example, an inert gas such as nitrogen (or any other suitable inert gas) may be used as a carrier for the precursor. In addition, a carrier gas that is cooled (e.g., cooled to room temperature or below) may be used to help control (e.g., reduce the occurrence of) pre-reactions that might otherwise take place (e.g., at the high temperatures) in the precursor delivery manifold rather than in the precursor reaction zone. When the precursor is introduced in a vapor phase, it may be advantageous to take steps (e.g., increasing the total volume of the precursor-inclusive stream) to help ensure that the amount of condensation is reduced. Additionally, the precursor may be provided as an atomized solution so as to help reduce the occurrence of condensation of the precursor along the precursor delivery manifold.

In certain example embodiments, a method of forming a coating on a glass substrate is provided, and/or a method of making a coated article comprising a coating supported by a substrate is provided. A burner having first and second spaced-apart combustion gas manifolds is configured to respectively produce first and second flames (which may effectively combine to form a single flame front beyond the outer face of the burner in certain example embodiments). A precursor reaction zone is formed between the first and second flames. A precursor used in forming the coating is provided substantially directly to a desired or predetermined portion of the precursor reaction zone via a vertically adjustable precursor delivery manifold located between the first and second combustion gas manifolds. It will be appreciated that the portion of the precursor reaction zone that is desirable may vary, e.g., in dependence on the particular application. The precursor delivery manifold includes first and second cooled walls arranged to reduce the occurrence of precursor pre-reactions upstream of the precursor reaction zone.

It will be appreciated that other techniques may be used (e.g., in place of, or in addition to, cooling the manifold walls) to keep the precursor cool enough to reduce the occurrence of pre-reaction. Examples include using a chilled carrier gas (e.g., when a liquid delivery is used), increasing the velocity of the gas through the manifold (e.g., by altering the manifold dimensions, increasing the carrier gas flow rate to a reasonable rate, etc.), and/or the like.

The burner designs of certain example embodiments convey a number of advantages. For example, the burner designs of certain example embodiments may provide enhanced reaction control capability, improved control over material properties, greater deposition efficiency, higher dynamic deposition rates, greater compatibility with highly reactive precursors, and/or better coating uniformity.

It will be appreciated that while a layer or coating is "on" or "supported by" a substrate (directly or indirectly), other layer(s) may be provided therebetween. Thus, for example, a coating may be considered "on" and "supported by" the substrate even if other layer(s) are provided between the growth and the substrate. Moreover, certain growths or layers of a coating may be removed in certain embodiments, while others may be added in other embodiments of this invention without departing from the overall spirit of certain embodiments of this invention.

It will be appreciated that the techniques described herein can be applied to a variety of metal oxides, and that the present invention is not limited to any particular type of metal oxide deposition and/or precursor. For example, oxides of the transition metals and lanthanides such as, for example, Y, Ti, Zr, Hf, V, Nb, Ta, Cr, Mo, W, La, Ce, Cr, Mo, W, Mn, Fe, Ru, Co, Ir, Ni, Cu, and main group metals and metalloids such as, for example, Zn, Cd, B, Al, Ga, In, Si, Ge, Sn, Sb and Bi, and mixtures thereof can all be deposited using the techniques of certain example embodiments.

It will be appreciated that the foregoing list is provided by way of example. For example, the metal oxides identified above are provided by way of example. Any suitable stoichiometry similar to the metal oxides identified above may be produced. Additionally, other metal oxides may be deposited, other precursors may be used in connection with these and/or other metal oxide depositions, the precursor delivery techniques may be altered, and/or that other potential uses of such coatings may be possible. Still further, the same or different precursors may be used to deposit the same or different metal oxides for a metal oxide matrix coating and/or embedded nano-particles.

Also, it will be appreciated that the techniques of the example embodiments described herein may be applied to a variety of products. That is, a variety of products potentially may use the AR films alluded (e.g., using the same or different process conditions) to above and/or other AR films, depending in part on the level of transmission gain that is obtained. Such potential products include, for example, photovoltaic, green house, sports and roadway lighting, fireplace and oven doors, picture frame glass, etc. Non-AR products also may be produced.

The example embodiments described herein may be used in connection with other types of multiple layer (e.g., multi-layer AR) coatings, as well. By way of example and without limitation, multiple reagents and/or precursors may be selected to provide coatings comprising multiple layers.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A burner for use in combustion deposition depositing a coating on a substrate, comprising:
   first and second spaced-apart combustion gas manifolds each comprising first and second walls configured to respectively produce first and second flames, the first and second combustion gas manifolds forming a precursor reaction zone therebetween; and
   an adjustable precursor delivery manifold located between the first and second combustion gas manifolds configured to receive a precursor used in forming the coating, the precursor delivery manifold being positioned so as to substantially directly provide the precursor to a predetermined portion of the precursor reaction zone, wherein the precursor delivery manifold includes first and second cooled side walls arranged to reduce the occurrence of precursor pre-reactions upstream of the precursor reaction zone, and wherein the first and second cooled side walls of the precursor delivery manifold are separate from the walls of the first and second combustion gas manifolds.

2. The burner of claim 1, further comprising at least one capillary system configured to receive a heat transfer liquid.

3. The burner of claim 2, wherein the at least one capillary system is formed in the precursor delivery manifold.

4. The burner of claim 1, further comprising first and second ceramic refractories surrounding the first and second cooled walls.

5. The burner of claim 1, wherein each said combustion gas manifold includes a plurality of bleed holes and/or at least one baffle arranged to provide a substantially uniform gas flow across a face thereof.

6. The burner of claim 1, wherein each said combustion gas manifold includes a substantially linear or planar a face.

7. The burner of claim 1, wherein the precursor delivery manifold is vertically adjustable.

8. The burner of claim 7, further comprising a rack and gear adjustment mechanism for vertically adjusting the precursor delivery manifold.

9. The burner of claim 1, further comprising cooling vents and/or fins.

10. The burner of claim 1, wherein the precursor delivery manifold is configured to provide to the combustion reaction zone a substantially uniform distribution of a carrier that includes the precursor.

11. The burner of claim 1, wherein the first and second flames form a single flame front.

12. The burner of claim 1, wherein the precursor delivery manifold comprises a high temperature superalloy.

13. The burner of claim 1, wherein the precursor delivery manifold comprises a tungsten-inclusive alloy.

14. A combustion deposition burner, comprising:

first and second spaced-apart combustion gas manifolds configured to respectively produce first and second flames, the first and second combustion gas manifolds forming a precursor reaction zone therebetween;

a vertically adjustable precursor delivery manifold located between the first and second combustion gas manifolds configured to receive a precursor, the precursor delivery manifold being positioned so as to substantially directly provide the precursor to a predetermined portion of the precursor reaction zone and being at least partially defined by first and second cooled walls arranged to reduce the occurrence of precursor pre-reactions upstream of the precursor reaction zone;

at least one capillary system configured to receive a heat transfer liquid; and first and second ceramic refractories surrounding an exterior portion of the first and second cooled walls, wherein each said combustion gas manifold includes a plurality of bleed holes and/or at least one baffle arranged to provide a substantially uniform gas flow across a face thereof, and wherein the precursor delivery manifold is configured to provide to the combustion reaction zone a substantially uniform distribution of a carrier that includes the precursor.

15. The burner of claim 14, wherein the at least one capillary system is formed in the precursor delivery manifold.

16. The burner of claim 14, wherein each said combustion gas manifold includes a substantially linear or planar a face.

17. The burner of claim 14, further comprising a rack and gear adjustment mechanism for vertically adjusting the precursor delivery manifold.

18. The burner of claim 14, further comprising cooling vents and/or fins.

19. The burner of claim 14, wherein the first and second flames form a single flame front.

* * * * *